United States Patent
Owen et al.

(10) Patent No.: US 7,005,925 B2
(45) Date of Patent: Feb. 28, 2006

(54) LOW NOISE SYNTHESIZER AND METHOD EMPLOYING FIRST TUNABLE SOURCE AND FIRST AND SECOND REFERENCE SOURCES

(75) Inventors: David Paul Owen, Dunstable (GB); Adrian Mark Jones, Letchworth (GB)

(73) Assignee: Aeroflex International Limited, Stevenage (GB)

( * ) Notice: Subject to any disclaimer, the term of this patent is extended or adjusted under 35 U.S.C. 154(b) by 0 days.

(21) Appl. No.: 10/498,151

(22) PCT Filed: Dec. 13, 2002

(86) PCT No.: PCT/GB02/05669

§ 371 (c)(1),
(2), (4) Date: Jun. 8, 2004

(87) PCT Pub. No.: WO03/052937

PCT Pub. Date: Jun. 26, 2003

(65) Prior Publication Data

US 2005/0073368 A1    Apr. 7, 2005

(30) Foreign Application Priority Data

Dec. 14, 2001    (GB) .................................. 0129998

(51) Int. Cl.
*H03L 7/00*        (2006.01)
(52) U.S. Cl. ............................ 331/2; 331/22
(58) Field of Classification Search .............. 331/2, 331/22

See application file for complete search history.

(56) References Cited

U.S. PATENT DOCUMENTS 4,551,689 A    11/1985    Scala et al.
6,061,575 A    5/2000    Lombardi
6,396,355 B1 *    5/2002    Rezin ........................... 331/18

FOREIGN PATENT DOCUMENTS

EP    0 125790 A2    11/1984

OTHER PUBLICATIONS

International Search for PCT Application No. PCT/G02/05669, Filed Dec. 13, 2002; Completion Date Feb. 26, 2003; Date of Mailing Mar. 11, 2003.

* cited by examiner

*Primary Examiner*—Joseph Chang
(74) *Attorney, Agent, or Firm*—Alston & Bird LLP

(57) ABSTRACT

A low noise sinusoidal signal at a desired output frequency is synchronised using a first variable frequency oscillator (1) and providing a feedback control loop around the first oscillator (1) to generate a feedback control signal in successive frequ comparison steps using second and third frequency reference signals (44, 42). Each of the second and third frequency reference signals are derived from a first frequency reference signal, the second frequency reference signal (44) being compared with the output frequency of the first oscillator (1) to generate a frequency difference signal (43), and said frequency difference signal ( being compared in frequency with the third frequency reference signal (42) to generate said feedback control signal for the first oscillator (1), the frequency of the third frequency reference signal (42) being equal to the difference of the frequency of the se frequency reference signal (44) and the desired output frequency. The second and third frequency reference signals (44, 42) are generated by respective second and third frequency reference sources, the second frequency reference source comprising a second variable frequency oscillator (38) the frequency of which is maintained in a limited range around its optimum natural frequency to give optimum performance in producing a low noise output from the first oscillator (1).

28 Claims, 4 Drawing Sheets

LOW NOISE SYNTHESIZER AND METHOD EMPLOYING FIRST TUNABLE SOURCE AND FIRST AND SECOND REFERENCE SOURCES

TECHNICAL FIELD

This invention relates to a method and apparatus for synthesising a low noise sinusoidal signal at a desired output frequency.

Low noise frequency synthesiser systems are required in signal generators in order adequately to test high performance RF systems and components. To ensure that a signal source has low phase noise, multiple phase locked loops are typically used, but the added complexity of these loops can give rise to more complex phase noise profiles, can compromise frequency settling time, or generate new spurious signals. Frequently there are performance compromises to be made in the design and these often result in less than optimum performance of one or more characteristics.

Single loop fractional N synthesisers are known, such as disclosed in EP 0125790. This type of synthesiser maintains a high phase detector rate while still having fine frequency control by manipulation of the division ratio of the divider in a phase locked loop such that the noise generated is frequency shaped. The added noise is removed by the natural filtering action of the phase locked loop filter.

Another known synthesiser disclosed in GB 2103035, uses a free running oscillator, optimised for low noise rather than frequency of operation, which is then multiplied and used in a phase locked loop to improve the noise performance of an RF oscillator. The frequency error introduced by the free running oscillator is eliminated by using a fractional N divider which fine tunes the frequency of an interpolation oscillator in the phase locked loop. However, the phase locked loop typically has a low bandwidth which results in relatively slow frequency settling characteristics. Furthermore, the close to carrier noise performance (less than 50 Hz offset) is modest and has a steeply increasing characteristic with lower offset frequencies, making it difficult to optimise bandwidth. However, this scheme does result in excellent 1 kHz and 20 kHz offset performance.

A synthesiser using a free running crystal oscillator may also use the fractional multiplier system disclosed in U.S. Pat. No. 4,914,405. This allows a fractional multiplication of the crystal oscillator frequency, which raises the frequency of the crystal oscillator and so reduces the noise multiplication in getting to a particular frequency. This improves the noise characteristics of the resulting multiplied signal.

The objective of this invention is to provide a frequency synthesiser that has the potential for low noise performance in a flexible manner.

The invention preferably uses both the fractional N technique and the fractional multiplier technique but seeks to avoid the frequency agility and close to carrier noise compromises of the synthesiser disclosed in GB 2103035. Furthermore, the invention can preferably be added to an existing signal generator to improve its RF characteristics with minimal impact on its design.

STATEMENT OF INVENTION

According to the invention, a low noise sinusoidal signal is generated at a desired output frequency using a first variable frequency oscillator and providing a feedback control loop around the first oscillator to generate a feedback control signal in successive frequency comparison steps using second and third frequency reference signals, each of the second and third frequency reference signals being derived from a first frequency reference signal, the second reference signal being compared with the output frequency of the first oscillator to generate a frequency difference signal, and said frequency difference signal being compared in frequency with the third frequency reference signal to generate said feedback control signal for the first oscillator, the frequency of the third frequency signal being equal to the difference of the frequency of the second frequency reference signal and the desired output frequency, the second and third frequency reference signals being generated by respective second and third frequency reference sources, the second frequency reference source comprising a second variable frequency oscillator the frequency of which is maintained in a limited range around its optimum natural frequency to give optimum performance in producing a low noise output from the first oscillator.

DESCRIPTION OF THE DRAWINGS

The invention will now be described by way of example with reference to the accompanying drawings in which.

DETAILED DESCRIPTION OF THE INVENTION

Figure 1:
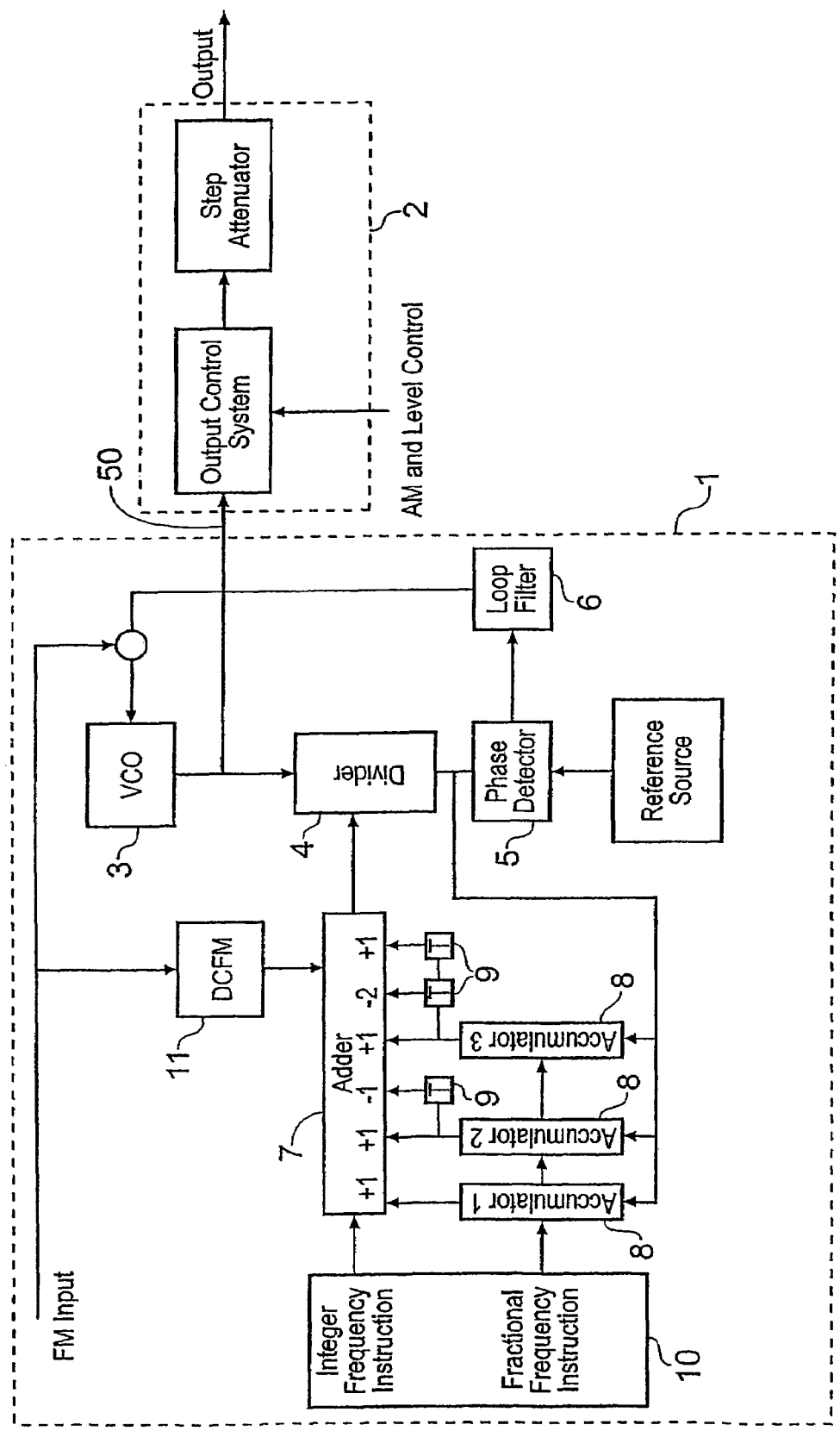
FIG. 1 is a schematic drawing of a fractional N synthesiser as used in a signal generator.

FIG. 1 shows a simplified diagram of a single loop synthesiser 1 using the fractional N technique according to EP 0125790 in a RF signal generator. The output from the voltage controlled oscillator 3 is divided by a fractional divider 4 whose division ratio is manipulated to avoid the introduction of low frequency noise while maintaining the average division at the required value The division ratio is controlled by means of an adder 7 and a series of cascaded accumulators 8 and delay devices 9. An input interface device 10 determines the division ratio, the most significant bits of the ratio determining the integer portion of the ratio in the adder 7, and the least significant bits of the ratio determining the fractional portion of the ratio via the accumulators 8 and delay devices 9. The manner in which data is transferred from one accumulator to another and produces positive or negative inputs to the adder to vary its division ratio in a sequential manner is described more fully in EP0125750.

The output from the divider is compared in phase with a frequency standard in a phase detector 5 and the resulting signal goes to the loop filter 6 before being used to correct the oscillator frequency. A second output from the voltage controlled oscillator 3 is used to drive the RF processing system of a signal generator 2 to provide amplitude modulation and to control its RF level. DC coupled frequency modulation is provided by a combination of directly modulating the voltage controlled oscillator 3 and modulating the division ratio of the divider 4. A technique employing a one-bit sigma delta converter to achieve this is described in EP 0322139.

The close-to-carrier noise performance of such a signal generator is dominated by the fractional N synthesiser components (mainly the divider and phase detector noise) and further out (from approximately 10 kHz) by the noise performance of the oscillator. In practice, the noise performance of the oscillator does not meet the objective of being a low noise source because of fundamental physical characteristics that are difficult to circumvent in such a simple scheme. However, the synthesis scheme does provide good frequency agility since the phase locked loop bandwidth is typically between 1 kHz and 10 kHz.

Figure 2:
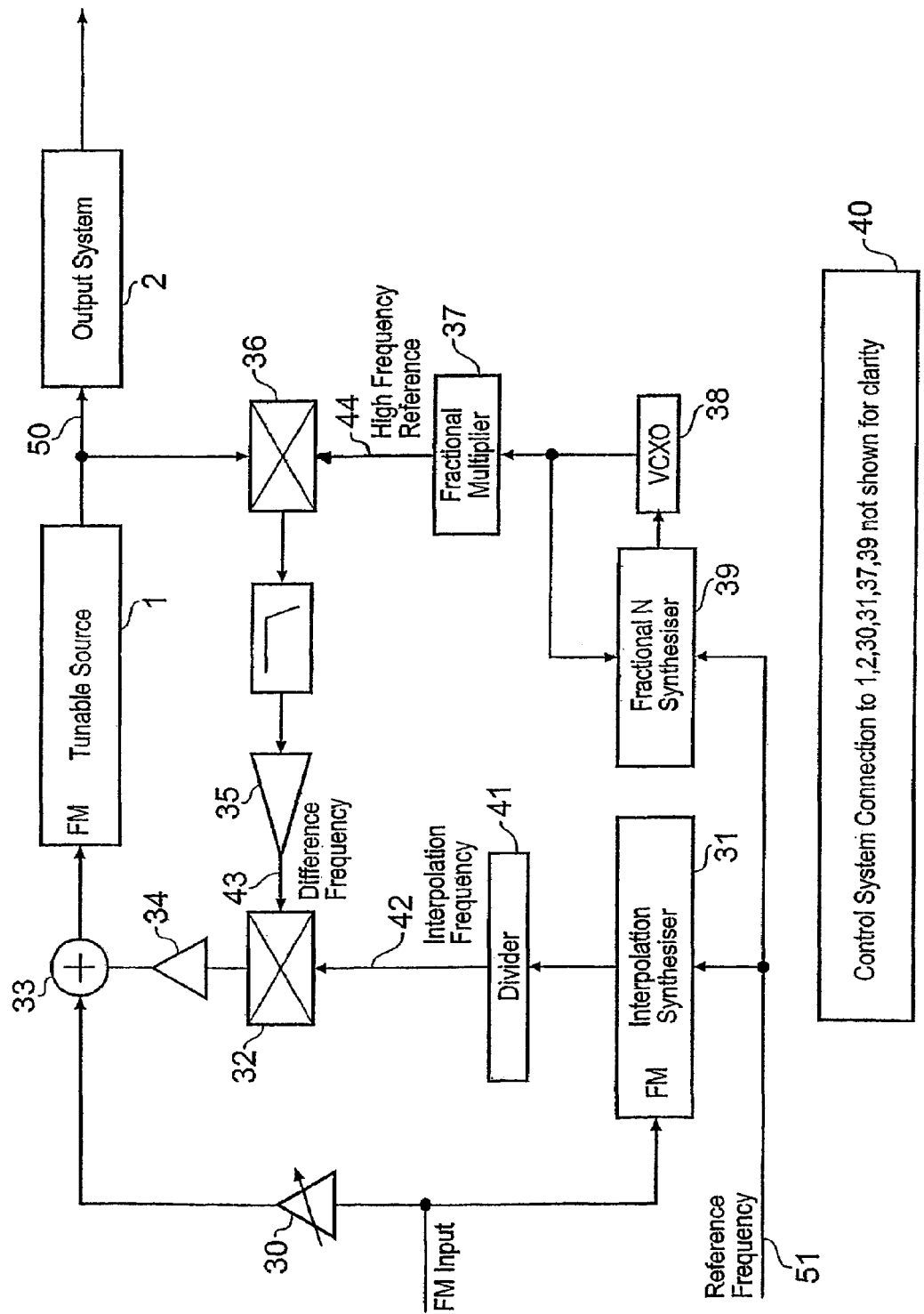
FIG. 2 is a schematic drawing of a synthesiser according to the invention.

The invention is disclosed in FIG. 2. The invention applies a phase locked loop around a voltage tunable frequency source 1, to control its frequency and its phase noise. The source may be a simple VCO, or is preferably a synthesiser as shown in FIG. 1, tuned via its FM input. The applied phase locked loop does not modify the operation of the tunable source in any way. This allows a signal generator using the invention to switch off the applied phase locked loop and revert to the original performance of the tunable frequency source, when performance which conflicts with low noise operation is required.

A high frequency low noise voltage controlled oscillator 38 is phase locked to a frequency standard using a fractional N synthesiser 39. The oscillator is preferably a voltage controlled crystal oscillator (VCXO), but may also be based on other resonator technologies such as Surface Acoustic Wave or Dielectric Resonator. The VCXO 38 is designed for optimum phase noise and has restricted ability to be voltage tuned. The frequency that the VCXO is set to is determined by adjusting the fractional N divider ratio until the VCXO tuning voltage is approximately in the centre of its control range. The frequency set by the VCXO synthesiser 38,39 is therefore known by the control system 40, but is dependent upon the physical and electrical characteristics of the VCXO and may not be the same from one oscillator to another. This frequency may change during the life of the instrument as the VCXO ages. The frequency is therefore known but is not predetermined.

Figure 3:
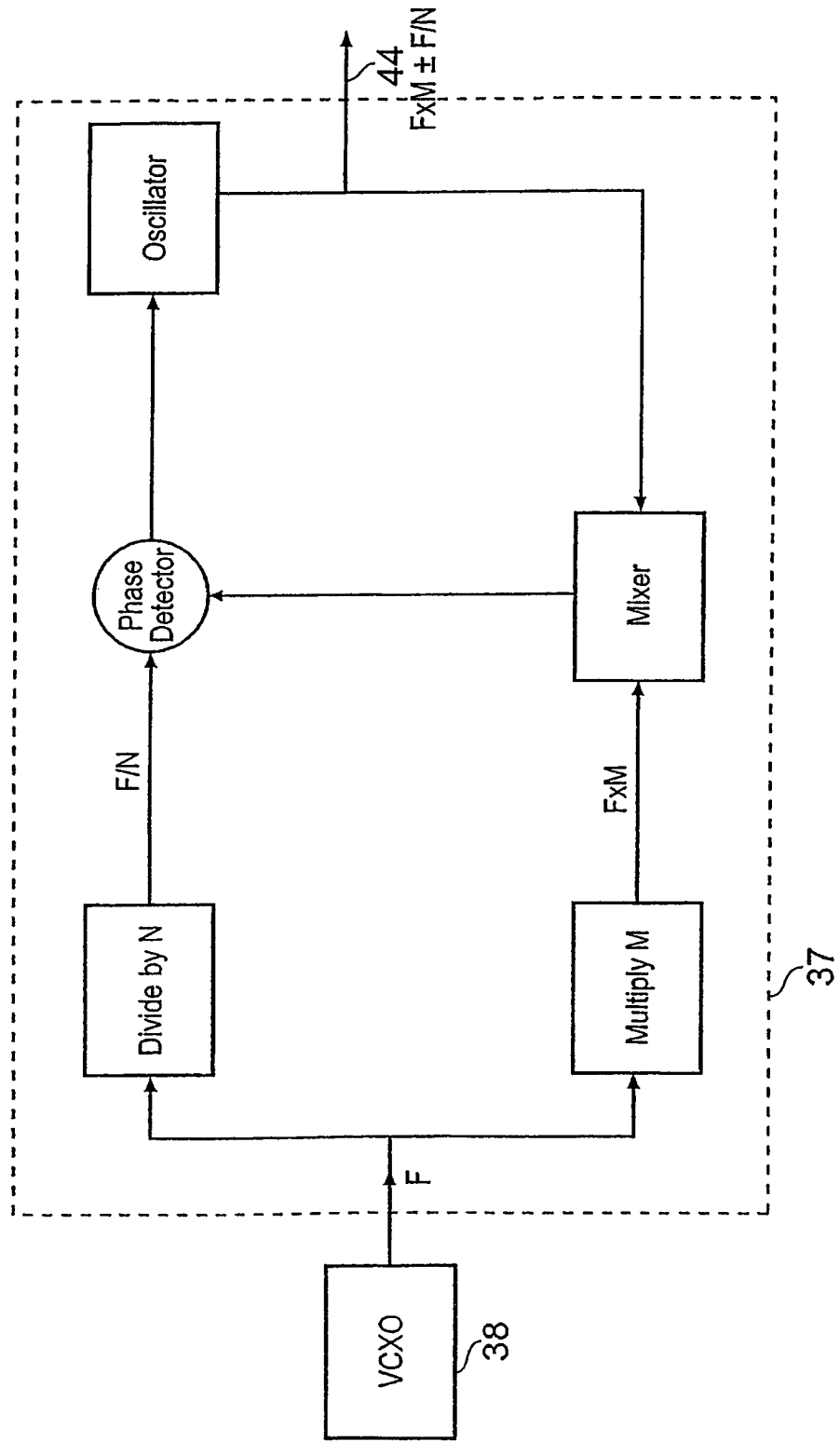
FIG. 3 is a schematic drawing of a fractional N multiplier as used in the synthesiser of FIG. 2.

The output from the VCXO 38 is then multiplied to a low noise high frequency reference signal 44, preferably using a fractional multiplier 37 shown in more detail in FIG. 3, and based in part on U.S. Pat. No. 4,914,405.

The high frequency reference signal 44 is then compared to the tunable source 1 output in a mixer 36. The output from the mixer is filtered to remove the sum products and amplified by amplifier 35, to produce the difference frequency signal 43.

A fine interpolation synthesiser 31 is used to generate a lower frequency synthesised interpolation signal 42. This synthesiser 31 can be based on a fractional N synthesiser and could advantageously be a higher frequency design that is divided in frequency by a divider 41 to improve its noise performance. It provides good phase noise characteristics and preferably fine frequency control because of its restricted frequency cover and lower frequency. The phase noise of the interpolation signal 42 at the input to the mixer 32 would typically have a noise performance better than that offered by the synthesiser shown in FIG. 1 by the ratio of the divider 41, given the same ratio of frequency cover.

The interpolation signal 42 and the difference frequency 43 are then compared in another mixer 32 acting as a phase detector. The resulting output is filtered by loop filter 34 then applied to the FM input of the voltage tunable source 1. This completes a phase locked loop where the output frequency is determined by the sum or difference of the high frequency reference signal 44 and the interpolation signal 42.

When the tunable source is a synthesiser such as shown in FIG. 1, its output frequency can be set to the correct value for the applied phase locked loop. When the tunable source is a VCO, additional steps must be taken to pre-steer its frequency to a suitable value, such that the difference frequency is sufficiently close to that of the interpolation oscillator for lock to be acquired.

The phase locked loop 36, 35, 32, 34 wraps a wide-band phase lock around the tunable source. The loop has good phase noise, and thereby removes phase noise that would otherwise be present on the output of the tunable source. The noise performance of this loop is inherently good because of the use of the low noise VCXO 38 and the interpolation synthesiser 31.

It has already been stated that the frequency of the VCXO 38 is not predetermined, in order to ensure it has a good noise performance. However, the frequency is known and the control system can either take account of the frequency in calculating the setting of each of the system blocks or by simply applying an offset to the interpolation synthesiser 31. The first method has the advantage that the frequency cover of the interpolation synthesiser is fixed since it does not have to correct for the departure of the VCXO from its normal value. The second method has the advantage that as the frequency is changed, the system's use of sum/difference signals and fractional multiplier values obeys a fixed set of rules. This can make it easier to predict performance changes with frequency and diagnose problems, but the frequency cover of the interpolation synthesiser 31 has to extend to cover the worse case frequency error.

The synthesiser system is controlled by a control system 40, which monitors the VCXO 38 behaviour and controls the settings of the key elements of the synthesiser according to the user's requested frequency.

The FM input via adder 33 provides a modulation path with a high pass frequency response. The FM that is added into the loop will appear to the loop as a phase error, and will be reduced by normal feedback loop action at modulation frequencies within the loop bandwidth. Only modulation at frequencies higher than the loop bandwidth causes frequency modulation of the tunable source. This path cannot provide frequency modulation at DC or at low modulation frequencies.

In order to provide useful FM, the FM input also goes to the interpolation synthesiser 31, which modulates the interpolation frequency 42. This path has a low pass frequency response, as the phase locked loop will cause the tunable source to follow changes in its frequency reference signals 42 and 44 only up to the loop bandwidth.

The two FM paths together, when matched in gain, provide FM control of the whole synthesiser for modulation frequencies of DC to an upper limit determined by the tunable source rather than the phase locked loop. The attenuator 30 provides gain control to match the two paths.

The FM signal to the interpolation synthesiser will need inverting when the phase locked loop is using a high frequency reference signal 44 which is higher than the final output frequency, the inverter being switched in or out according to the use of difference or sum signals.

Figure 4:
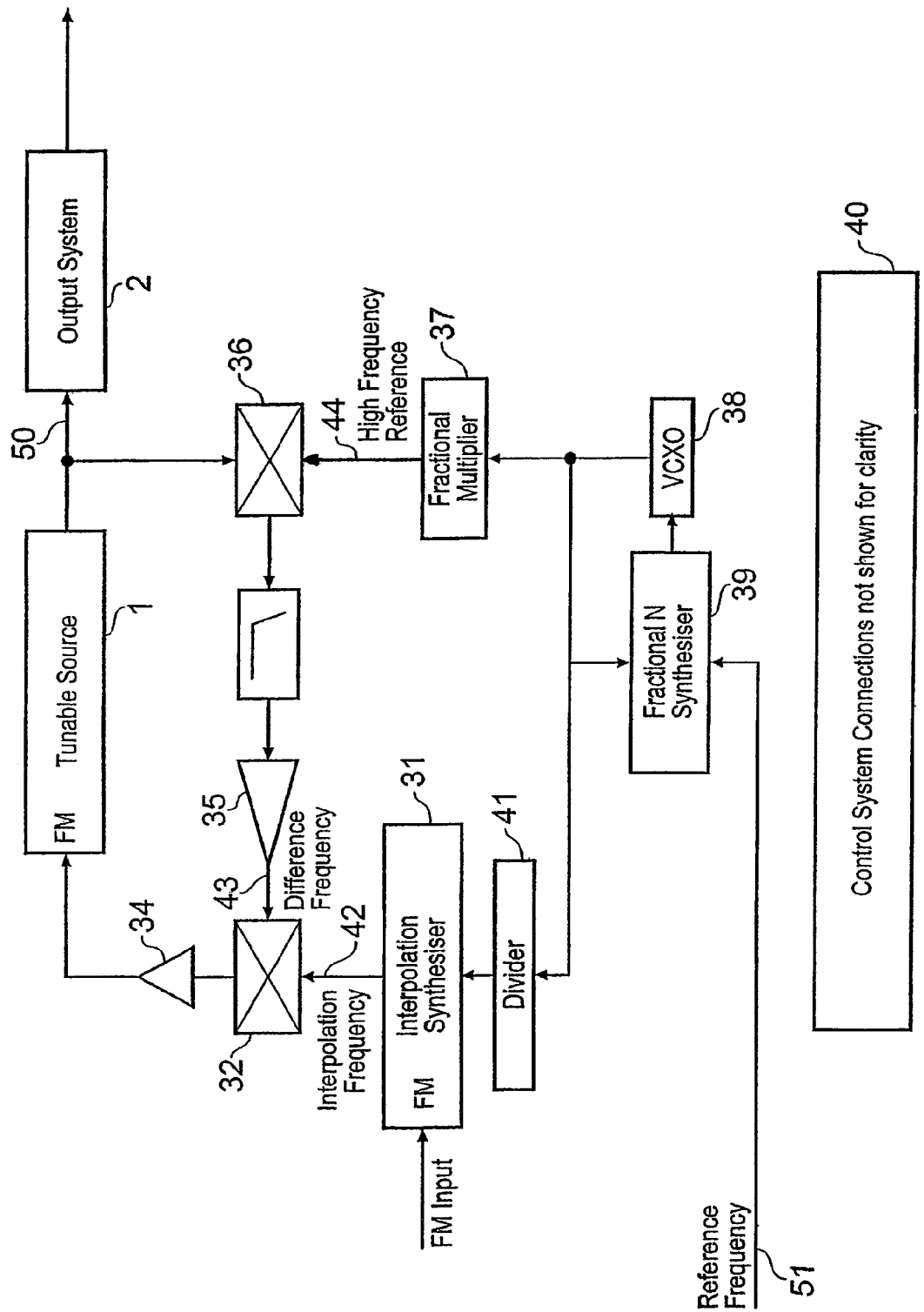
FIG. 4 is a schematic drawing of an alternative synthesiser according to the invention.

The synthesiser can be frequency modulated using only the low pass frequency response path through the interpolation synthesiser. This embodiment is illustrated in FIG. 4, which uses similar references for similar components shown in FIG. 2. However compared with FIG. 2, the FM input only goes to the interpolation synthesiser 31, and not to the tunable source 1. While simpler and avoiding gain matching, this limits the FM performance in two ways. The first limitation is the available modulation bandwidth, which is now limited by the phase locked loop bandwidth, rather than the performance of the tunable source. The second limitation is subtler. When two point modulation is in use, mixer 32 handles only the errors within the loop, with the bulk of the tunable source tuning voltage being provided through adder 33. When modulating via the interpolation synthesiser only, the tuning voltage to the tunable source is now derived entirely from the output of mixer 32. Therefore, mixer 32 is required to handle larger phase differences when the adder 33 path is not used. One effect of this is to limit the modulation index available, due to mixer 32 running out of range. A more subtle effect is to worsen the noise and spurious response of the phase locked loop, as mixer 32 is required to work over parts of its range that may not be optimal.

Also, while in FIG. 2, the interpolation synthesiser 31, is supplied with the same reference frequency as the VCXO based fractional-N synthesiser 39, in FIG. 4, the output of the VCXO is used as the reference for the interpolation synthesiser 31. The VCXO output may also be divided in frequency prior to being used as the reference for the interpolation synthesiser. The use of the VCXO as reference for the interpolation synthesiser may give lower phase noise at medium offset from the carrier than using some types of frequency reference.

It is also apparent that the scheme shown in FIG. 2 can be very simply changed such that it is identical to the scheme shown in FIG. 1 by disabling the phase locked loop by setting the output of the mixer 32 to zero. The FM input now arrives at the tunable source input without modification. It therefore allows the user to revert to a synthesiser that has a wider frequency modulated bandwidth.

The loop bandwidth of the loop can also be very easily adjusted to provide optimum performance; for example, by adjusting the gain in the phase locked loop, which could be achieved using elements common to the FM circuits. When the tunable source is implemented as a synthesiser, it can always be presteered exactly regardless of the overall phase locked loop settings. A VCO implementation will require the source presteer accuracy to be compatible with the phase locked loop capture performance.

The frequency settling time of the system is improved compared to GB 2103035. The settling time of the outer loop will be very fast since it typically has a very large bandwidth. The settling time of a tunable source based on the fractional N system of FIG. 1 has only marginal impact because of the wide bandwidth outer loop. The main contributing factor to the settling time is therefore the interpolation synthesiser 31. Since this can be similar (or even identical—with frequency division to improve noise) to the FIG. 1 fractional N synthesiser, the settling time is of a similar order to the FIG. 1 fractional N synthesiser. Furthermore, making some adjustment to the bandwidth of the interpolation synthesiser allows easy optimisation of the noise performance against speed.

To improve the frequency settling time an adaptive loop bandwidth could be used that opens the loop bandwidth during frequency changes but closes the bandwidth down once the signal is at the required frequency.

What is claimed is:

1. A method of synthesising a low noise sinusoidal signal at a desired output frequency comprising using a first variable frequency source and providing a feedback control loop around the first variable frequency source to generate a feedback control signal in successive frequency comparison steps using second and third frequency reference signals, each of the second and third frequency reference signals being derived from a first frequency reference signal, the second frequency reference signal being compared with the output frequency of the first variable frequency source to generate a frequency difference signal, and said frequency difference signal being compared in frequency with the third frequency reference signal to generate said feedback control signal for the first variable frequency source, the frequency of the third frequency reference signal being equal to the difference of the frequency of the second frequency reference signal and the desired output frequency, the second and third frequency reference signals being generated by respective second and third frequency reference sources, characterised in that the first variable frequency sources comprises a first fractional N frequency synthesiser and the second frequency reference source comprises a second variable frequency oscillator the frequency of which is maintained in a limited range around its optimum natural frequency by a second fraction N frequency synthesizer to give optimum performance in producing a low noise output from the first variable frequency source.

2. A method as claimed in claim 1 in which the second frequency reference signal is of the same order of frequency as said desired output frequency, and the third frequency reference signal is of a lower frequency than the second frequency reference signal.

3. A method as claimed in claim 1 in which the second frequency reference source comprises a second voltage controlled oscillator that incorporates the second fractional N frequency synthesiser in a phase locked loop.

4. A method as claimed in claim 3 in which the second voltage controlled oscillator comprises a crystal oscillator.

5. A method as claimed in claim 1 in which the output of the second variable frequency oscillator is processed in a fractional multiplier to produce the second frequency reference signal.

6. A method as claimed in claim 1 in which the second variable frequency source has a reference frequency comprising the first frequency reference signal.

7. A method as claimed in claim 6 in which the third frequent reference source has a reference frequency comprising the first frequency reference signal.

8. A method as claimed in claim 6 in which the third frequency reference source has a reference frequency derived from the output of the second variable frequency oscillator.

9. A method as claimed in claim 1 in which the third frequency reference signal is adjusted to accommodate variations in the frequency of the second frequency reference signal.

10. A method as claimed in claim 1 in which the third frequency reference signal is generated by a third fractional N synthesiser.

11. A method as claimed in claim 10 in which the output of the third fractional N synthesiser is processed in a frequency divider to produce the third frequency reference signal.

12. A method as claimed in claim 1 in which a frequency modulation input signal (PM) is applied to a source of the second or third frequency reference signals.

13. A method as claimed in claim 12 in which the frequency modulation input signal is applied to the source of the third frequency reference signal and to the frequency control input of the first variable frequency source.

14. A method as claimed in claim 12 in which the frequency modulation input signal is also applied to the first variable frequency source so as to modulate its output signal.

15. A frequency synthesiser for producing a low noise sinusoid signal at a desired output frequency comprising a first variable frequency source whose output is controlled by a feedback control signal in a feedback control loop around said first variable frequency source, the feedback control loop comprising second and third frequency reference signal sources to produce respective second and third frequency reference signals derived from a first frequency reference signal, a first comparator which compares the output of the first variable frequency source with the output of the second frequency reference signal to produce a frequency difference signal, and a second comparator which compares the frequency difference signal with the third frequency reference signal to produce said feedback control signal, the frequency of the third frequency signal being equal to the difference between the frequency of the second frequency reference signal and the desired output frequency, characterised in that the first variable frequency source comprises a first fractional N frequency synthesiser and the second frequency reference source comprises a second variable frequency oscillator the frequency of which is maintained in a limited range around its optimum natural frequency by a second fractional N synthesiser to give optimum performance in producing a low noise output from the first variable frequency source.

16. A frequency synthesiser as claimed in claim 15 in which the second frequency reference source produces a second frequency reference signal of the same order of frequency as said desired output frequency, and the third frequency reference source produces a third frequency reference signal of a lower frequency than the second frequency reference signal.

17. A frequency synthesiser as claimed in claim 15 in which the second frequency reference source comprises a second voltage controlled oscillator that incorporates the second fractional N frequency synthesiser in a phase locked loop.

18. A frequency synthesiser as claimed in claim 17 in which the second voltage controlled oscillator comprises a crystal oscillator.

19. A frequency synthesiser as claimed in claim 15 in which the output of the second variable frequency oscillator is processed in a fractional multiplier to produce the second frequency reference signal.

20. A frequency synthesiser as claimed in claim 15 in which the second variable frequency source has a reference frequency comprising the first frequency reference signal.

21. A frequency synthesiser as claimed in claim 20 in which the third frequency reference sources (31,41) has a reference frequency comprising the first frequency reference signal.

22. A frequency synthesiser as claimed in claim 20 in which the third frequency reference source has a reference frequency derived from the output of the second variable frequency oscillator.

23. A frequency synthesiser as claimed in claim 15 in which the third frequency reference signal is adjusted to accommodate variations in the frequency of the second frequency reference signal.

24. A frequency synthesiser as claimed in claim 15 in which the third frequency reference signal is generated by a third fractional N synthesiser.

25. A frequency synthesiser as claimed in claim 24 in which the output of the third fractional N synthesiser is processed in a frequency divider to produce the third frequency reference signal.

26. A frequency synthesiser as claimed in claim 15 in which a frequency modulation input signal (FM) is applied to a source of the second and third frequency reference signals.

27. A frequency synthesiser as claimed in claim 26 in which the frequency modulation input signal (FM) is applied to the source of the third frequency reference signal and to the frequency control input of the first variable frequency source.

28. A frequency synthesiser as claimed in claim 26 in which the frequency modulation input signal (FM) is also applied to the first variable frequency source so as to modulate its output signal.

* * * * *